(12) United States Patent
Cheng et al.

(10) Patent No.: US 6,367,060 B1
(45) Date of Patent: Apr. 2, 2002

(54) METHOD AND APPARATUS FOR CLOCK TREE SOLUTION SYNTHESIS BASED ON DESIGN CONSTRAINTS

(76) Inventors: C. K. Cheng, 4407 Mensha Pl., San Diego, CA (US) 92130; Liang-Jih Chao, 40 Tissiack Ct., Fremont, CA (US) 94539

( * ) Notice: Subject to any disclaimer, the term of this patent is extended or adjusted under 35 U.S.C. 154(b) by 0 days.

(21) Appl. No.: 09/336,257

(22) Filed: Jun. 18, 1999

(51) Int. Cl.[7] .............................................. G06F 17/50
(52) U.S. Cl. ............................................ 716/10; 716/6
(58) Field of Search ............................ 716/1, 2, 4, 6, 716/7, 10; 703/19

(56) References Cited

U.S. PATENT DOCUMENTS

| | | | |
|---|---|---|---|
| 5,140,526 A | * 8/1992 | McDermith et al. | 364/488 |
| 5,410,491 A | * 4/1995 | Minami | 364/491 |
| 5,519,351 A | * 5/1996 | Matsumoto | 327/295 |
| 5,553,002 A | * 9/1996 | Dangelo et al. | 364/489 |
| 5,557,779 A | * 9/1996 | Minami | 395/500 |
| 5,740,067 A | * 4/1998 | Hathaway | 364/489 |
| 5,963,728 A | * 10/1999 | Hathaway et al. | 716/3 |

OTHER PUBLICATIONS

Minami et al., "Clock Tree Synthesis Based on RC Delay Balancing," IEEE 1992 Custom Integrated Circuits Conference, pp. 28.3.1–28.3.4.*

Balboni et al., "Clock Skew Reduction in ASIC Logic Design: A Methodology for Clock Tree Management," IEEE Trans. on CAD of ICs and Systems, vol. 17, No. 4, Apr. 1998, pp. 344–356.*

Cho et al., "A Buffer Distribution Algorithm for High–Performance Clock Net Optimizatin," IEEE Trans. on VLSI Systems, vol. 3, No. 1, Mar. 1995, pp. 84–98.*

Krishnamurthy et al., "A New Partitioning Framework for Uniform Clock Distribution During High–Level Synthesis," 1988 IEEE, pp. 381–384.*

Mehta et al., "Clustering and Load Balancing for Buffered Clock Tree Synthesis," 1997 IEEE, pp. 217–223.*

* cited by examiner

*Primary Examiner*—Matthew Smith
*Assistant Examiner*—Leigh Marie Garbowski
(74) *Attorney, Agent, or Firm*—Columbia IP Law Group, PC

(57) ABSTRACT

A clock tree synthesizer calculates balanced cluster sets of nodes a particular level of a clock tree in a circuit description based on a set of available buffer types. Each balanced cluster set is tested to see if it meets a design constraint. If the design constraint is not met for a particular balanced cluster set, the particular cluster set is removed from consideration in the clock tree solution. For the cluster sets that do meet the design constraint, a cost associated with each cluster set is calculated. A balanced cluster set that has the lowest cost is selected for the clock tree solution. In one embodiment, the lowest cost balanced cluster set for one level in the clock tree forms the nodes for the next higher level in the clock tree, and the process is repeated at each level of the clock tree up to a root node. In another embodiment, the clock tree in the circuit description is modified with the lowest cost balanced cluster set for each level of the clock tree solution, wherein each cluster includes the buffer on which the cluster calculation was based.

20 Claims, 8 Drawing Sheets

METHOD AND APPARATUS FOR CLOCK TREE SOLUTION SYNTHESIS BASED ON DESIGN CONSTRAINTS

FIELD OF THE INVENTION

The present invention pertains to the field of integrated circuit (IC) design. More particularly, this invention relates to the art of synthesizing clock tree solutions.

BACKGROUND OF THE INVENTION

Since the advent of the integrated circuit (IC), circuit components have become smaller and smaller. An IC may include millions of components packed into an incredibly small package. With each new generation of smaller integration, more functionality, and therefore more value, can be derived from ICs. Reliably manufacturing these highly integrated ICs, however, presents significant design challenges.

In particular, designing ICs that meet timing constraints can be particularly difficult. An IC may include tens of thousands of registers that need to be connected to one or more clock sources. For each clock "tick", or clock transition, thousands of registers have to operate in concert. A complex network is needed to propagate the clock signal to each of the registers. If the difference in propagation delay through two different paths in the network is too large or too small, errors may occur that can cause the entire IC to fail.

Those skilled in the art will be familiar with numerous processes for synthesizing clock networks, or clock tree solutions. One of the most common approaches is a binary clock tree. A binary clock tree often begins by coupling registers into pairs. Then, pairs of register pairs are coupled together, pairs of pairs of register pairs are coupled together, and so on until the clock source, commonly referred to as the "root" or root node, is reached.

The result is a clock tree having a root and a series of branches reaching out to the registers. The registers are commonly referred to as "leaf nodes" on the tree. Between the root and the leaf nodes there may be several levels of intermediate nodes where paths branch.

Each register and each path adds a certain amount of load to the tree. The root usually cannot drive enough current into the tree to operate the cumulative load. In order to handle large trees, buffers are inserted into the tree at various intermediate nodes. Buffers receive a signal from an upstream driver, such as another buffer or the root node, and drive the signal to a number of down stream nodes.

A wide variety of approaches have been used to insert buffers in clock trees. For instance, the number of nodes coupled to a root may be counted, and one or more buffers inserted as needed. Then, each buffer can be treated like a root in a "sub-tree," and nodes can be counted and buffers inserted to create further sub-trees in a hierarchy that reaches out to the leaf nodes. Various design constraints can be tested, and the process repeated with different types of buffers and tree structures until a suitable solution is found.

As ICs continue to become more complex, having tens of thousand of registers which may be clocked by several different source clocks, at several different clock frequencies, through gated clocks, inverted clocks, etc., the processing time and expense required to meet continually more stringent design constraints using known approaches is becoming increasingly prohibitive.

Therefore, an improved method and apparatus for synthesizing clock tree solutions is needed.

SUMMARY OF THE INVENTION

The present invention beneficially provides an improved method and apparatus for synthesizing clock tree solutions. At a particular level of a clock tree in a circuit description, balanced cluster sets of nodes are calculated based on a set of available buffer types. Each balanced cluster set is tested to see if it meets a design constraint. If the design constraint is not met for a particular balanced cluster set, the particular cluster set is removed from consideration in the clock tree solution. For the cluster sets that do meet the design constraint, a cost associated with each cluster set is calculated. A balanced cluster set that has the lowest cost is selected for the clock tree solution.

In one embodiment, the lowest cost balanced cluster set for one level in the clock tree forms the nodes for the next higher level in the clock tree, and the process is repeated at each level of the clock tree up to a root node. In another embodiment, the entire clock tree is tested to see if it meets a second design constraint. In another embodiment, the clock tree is tested for setup time and/or hold time violations, and register positions within the clock tree are changed to eliminate any violations. In another embodiment, the clock tree in the circuit description is modified with the lowest cost balanced cluster set for each level of the clock tree solution, wherein each cluster includes the buffer on which the cluster calculation was based.

BRIEF DESCRIPTION OF THE DRAWINGS

Examples of the present invention are illustrated in the accompanying drawings. The accompanying drawings, however, do not limit the scope of the present invention. Similar references in the drawings indicate similar elements.

DETAILED DESCRIPTION

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. In other instances, well known methods, procedures, components, and circuits have not been described in detail.

Parts of the description will be presented using terminology commonly employed by those skilled in the art to convey the substance of their work to others skilled in the art. Also, parts of the description will be presented in terms of operations performed through the execution of programming instructions. As well understood by those skilled in the art, these operations often take the form of electrical, magnetic, or optical signals capable of being stored, transferred, combined, and otherwise manipulated through, for instance, electrical components.

Various operations will be described as multiple discrete steps performed in turn in a manner that is helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

Figure 1:
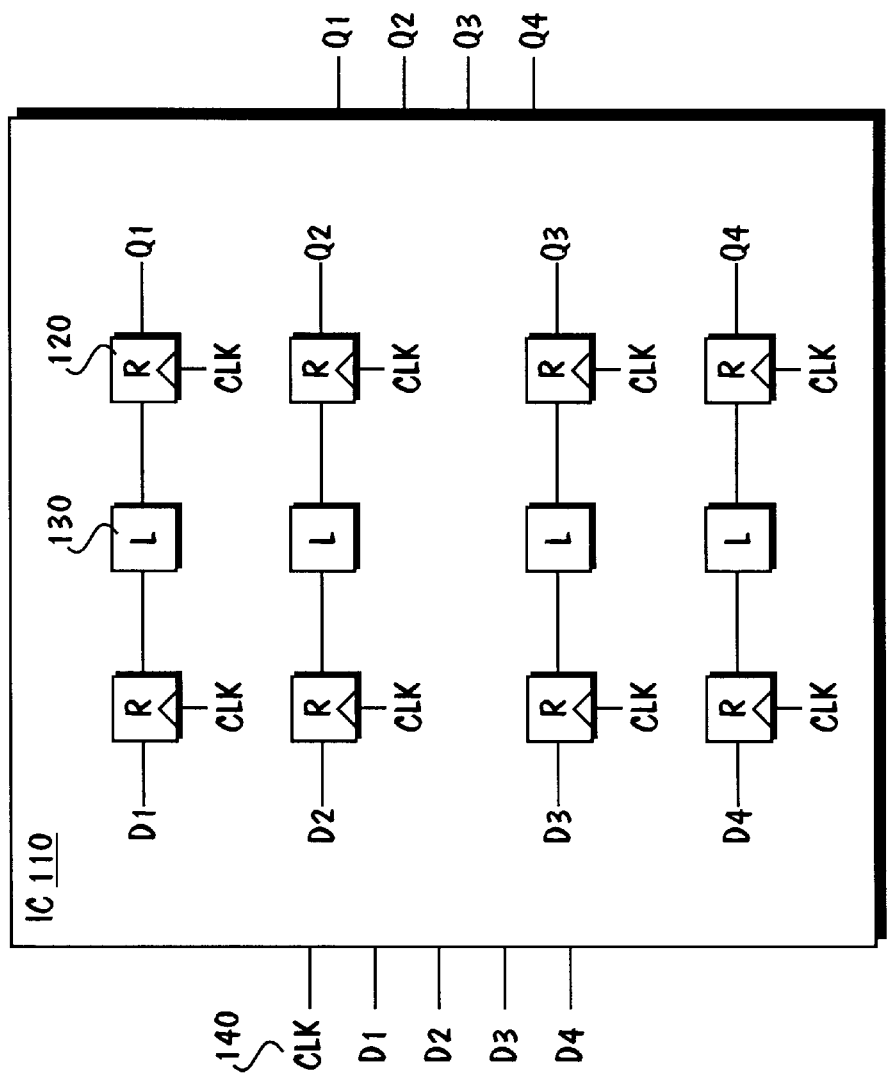
FIG. 1 illustrates one embodiment of an IC design.

The present invention provides an improved method and apparatus for synthesizing clock tree solutions in integrated circuit designs. FIG. 1 illustrates a very simple example of an integrated circuit (IC) design 110 as it may be defined, for instance, by a netlist prior to synthesizing a clock tree solution. Eight registers (R) 120 and four blocks of combinational logic (L) 130 are placed in the circuit design and coupled to each other and to input pins (D1, D2, D3, and D4) and output pins (Q1, Q2, Q3, and Q4) as shown. The netlist also defines a clock tree. Input clock pin (CLK) 140 is coupled to the clock pin of each of the registers 120. The netlist defines all of the connections but does not define how the connections are made.

Figure 2:
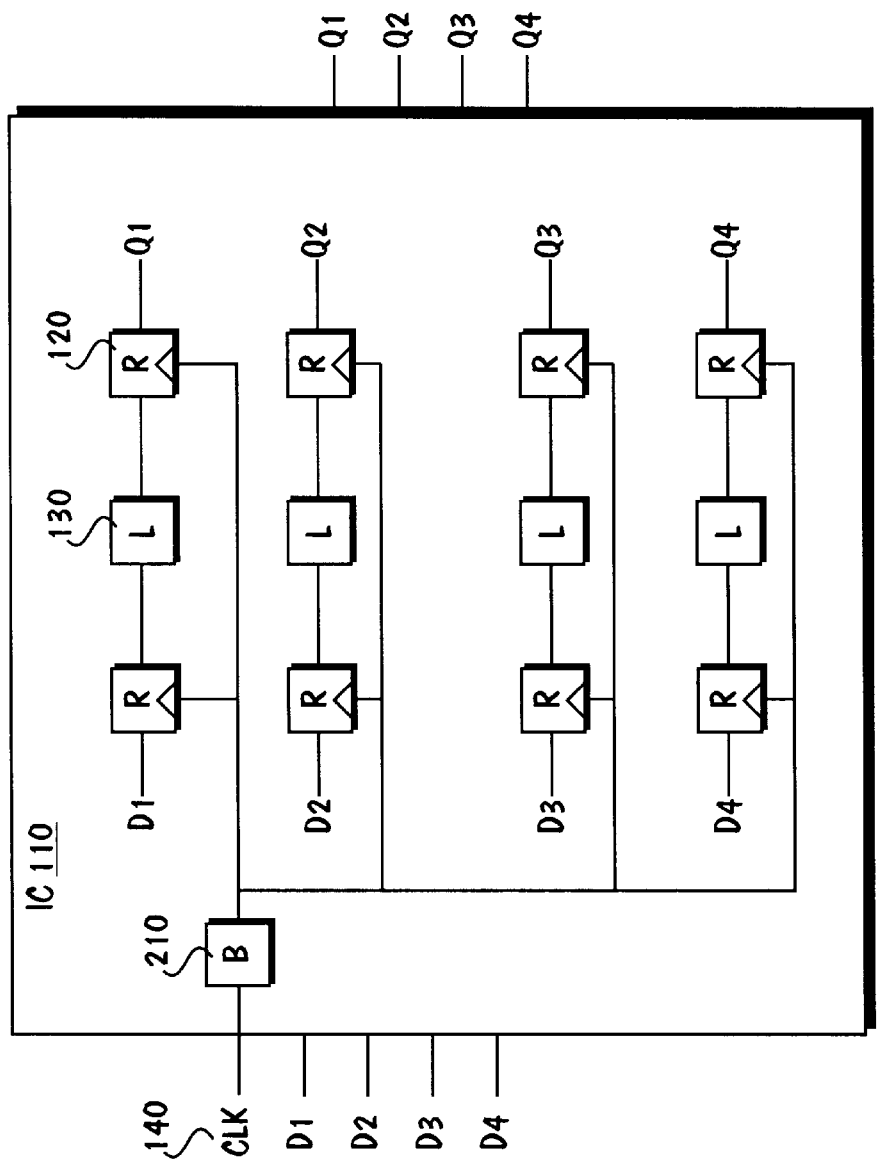
FIG. 2 illustrates one embodiment of the IC design with a clock tree solution.

CLK 140 is a root node in the clock tree and each register is a leaf node in the clock tree. If CLK 140 cannot drive enough current to operate all eight registers 120, one or more buffers need to be inserted in the clock tree. In a simple integrated circuit design like the one illustrated in FIG. 1, buffers could probably be inserted manually, for instance, by modifying the netlist using any of a number of user interfaces. FIG. 2 illustrates IC 110 with a modified clock tree including buffer 210 to drive the clock signal to each of the registers 120.

Manually modifying clock trees becomes much more difficult when circuits become more complex and design constraints become more stringent. For instance, timing constraints for IC 110 may include minimum and maximum propagation delay from CLK 140 to the registers 120, minimum and maximum clock transition time at each register 120, minimum and maximum delay through each logic block 130, and required setup and hold times for each register 120. The timing constraints may be very stringent, requiring a balanced solution with very little deviation in delay from one clock path to the next. Additional design constraints may state that CLK 140 can only drive one buffer, buffers that can be used in IC 110 can only drive up to three registers, each buffer introduces a certain amount of propagation delay and increases transition time by a certain amount, and the area available on IC 110 to add buffers is extremely limited, leaving room for no more than four buffers. With these design constraints, manually synthesizing a clock tree solution for even the simple IC design show in FIG. 1 is no trivial matter. For today's highly integrated circuits, often including tens of thousands of registers, manually synthesizing a clock tree solution is virtually impossible.

The present invention beneficially synthesizes clock tree solutions using design constraints and cost analysis to insert buffers and select node clusters that provide superior, balanced clock trees. A clock tree solution can then be added to a circuit description that is later used to route the connections in the IC design.

Figure 3:
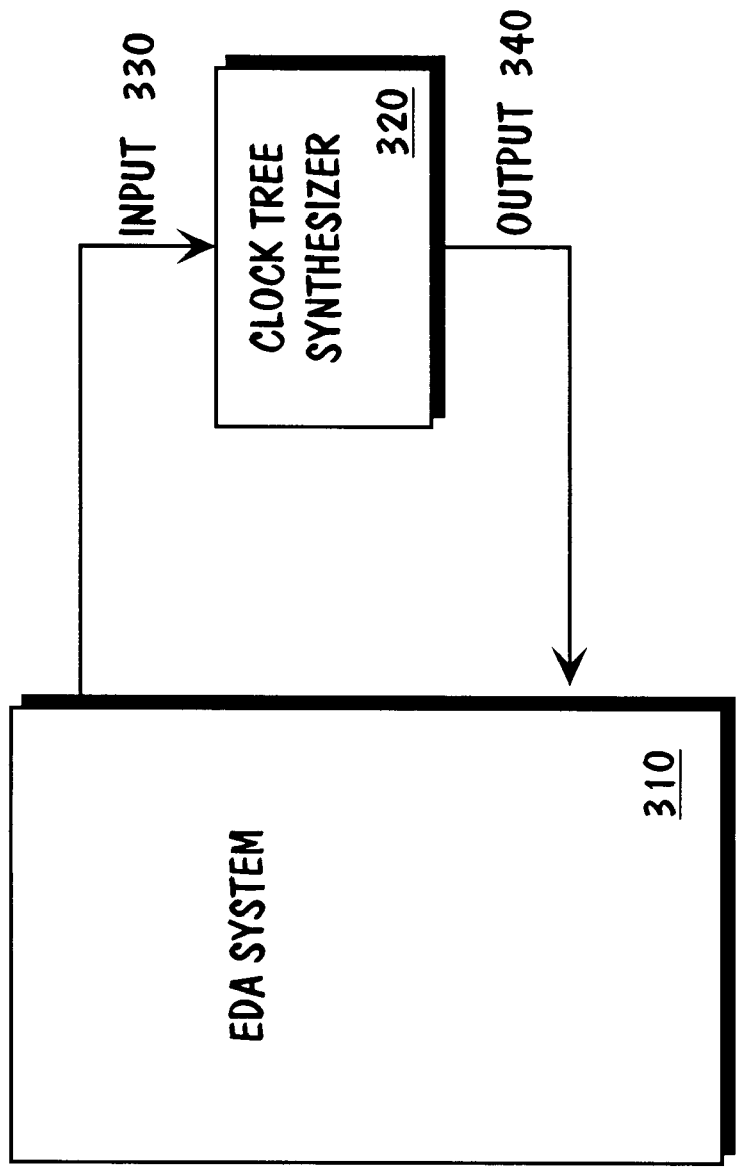
FIG. 3 illustrates one embodiment of the present invention.

FIG. 3 illustrates one embodiment of clock tree synthesizer 320 coupled to electronic design automation (EDA) system 310. Except for the teachings of the present invention, EDA system 310 represents any of a broad category of EDA systems. For instance, EDA system 310 may include capabilities for generating a gate-level IC design from hardware description language (HDL) files, including provision of a timing budget, generation of a floor plan, synthesis of gates, placement of gates, and routing of transmission paths.

EDA system 310 provides clock tree synthesizer 320 with input 330. Input 330 includes a circuit description in any of a number of formats. In one embodiment, input 330 includes component placement, timing constraints, and a set of available buffers. In response to input 330, clock tree synthesizer 320 provides output 340 which defines a clock tree solution for the circuit description. In one embodiment, EDA system 310 uses the clock tree solution to route the clock tree in the IC design.

Figure 4:
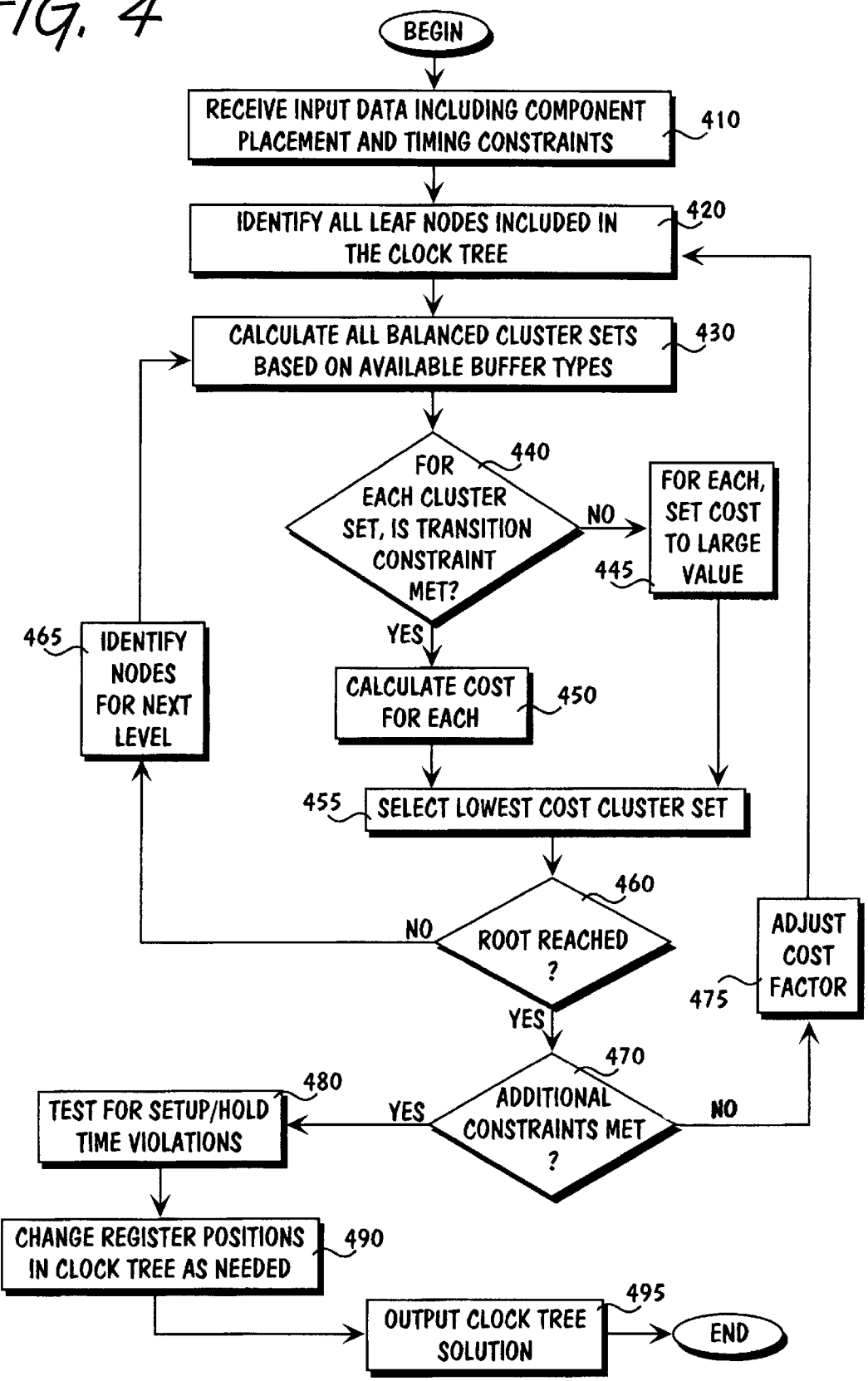
FIG. 4 illustrates a process of one embodiment of the present invention.

FIG. 4 demonstrates one embodiment of clock tree synthesizer 320. In general terms, clock tree synthesizer 320 groups clock tree nodes on a level-by-level basis starting with the level of nodes furthest from the root node. At each level, clusters of nodes are calculated in various ways depending on available buffer types, and a best cluster set for each level of the clock tree solution is selected based on a cost analysis. The embodiment illustrated in FIG. 4 includes a number of implementation specific details and various alternate embodiments.

In block 410, input data is received. In the illustrated embodiment, the input data includes component placement and timing constraints for a circuit design. Component placement includes coordinate locations of clock pins in one or more clock trees in the circuit design, such as source clock locations and the locations of clock inputs on each register, and a definition of component connections. Component placement may be in the form of a netlist.

Timing constraints may include data such as minimum and maximum propagation delay from the source clock to a clock pin of any register, minimum and maximum clock transition time at any register, hold time and setup time requirements for each type of register, and propagation delays through components such as registers, combinational logic, buffers, inverters, clock dividers, clock multipliers, etc. Timing constraints may also include propagation constants for calculating propagation delays through lengths of transmission paths.

In various embodiments, input data may also include design constraints defining one or more source clock wave forms, available area for inserting buffers and/or inverters, available types of buffers and/or inverters including maximum load for each buffer/inverter and area required to insert each buffer/inverter, and available layers in the IC design for clock tree routing.

Input data may also define pre-designed partial trees, also called sub-trees or macro-cells. The partial trees can be treated as a single terminal node from the perspective of the clock tree synthesizer. The input data for partial trees may include maximum and minimum propagation delay from the source clock up to the root of the partial tree, as well as the load the partial tree places on the clock tree.

Certain aspects of the input data can be user defined. For instance, in one embodiment, a default set of available buffers will be used unless a user defined set of buffers is included in the input data. The input data may also indicate certain user defined nodes that should be ignored or are to be treated as leaf nodes or terminal nodes, as in the case of a partial tree discussed above. Similarly, where two clock trees overlap, a user may be required to define certain nodes to be terminal nodes in order to separate the clock trees as viewed from the perspective of the clock tree synthesizer.

In block 420, leaf nodes for a given clock tree are identified. For instance, a root node can be selected from a netlist and all of the registers coupled to the root node as defined by the netlist can be identified. The set of identified leaf nodes may include tens of thousands of nodes. The set of leaf nodes comprise the outer most level of the clock tree.

Partial trees, as mentioned above, may be treated as terminal nodes in a clock tree. The timing constraints at the root of a partial tree, however, are likely to be different from the timing constraints at registers. For instance, the propagation delay from the clock tree root to each register in the clock tree must fall within a specified range, but the propagation delay from the clock tree root to the root of a partial tree may not fall within the same specified range. In which case, the partial tree needs to be given special consideration during clock tree synthesis. Partial trees, as well as other types of terminal nodes that are not leaf nodes, will be discussed more fully below.

Continuing on with FIG. 4, in block 430, balanced cluster sets of the leaf nodes are calculated based on the available types of buffers. For instance, in one embodiment, the set of available buffers includes five types of buffers that can drive loads up to 15, 10, 5, 3, and 2 registers respectively. In which case, if there are 150 thousand registers at the leaf node level in the clock tree, the registers could be clustered into a first balanced set of 10 thousand clusters of nodes driven by 10 thousand 15-output buffers, or a balanced set of 15 thousand clusters driven by 15 thousand 10-output buffers, or a balanced set of 30 thousand clusters driven by 30 thousand 5-output buffers, and so on for each buffer type.

Each buffer type has associated with it a certain amount of propagation delay and each buffer type impacts clock transition times at the registers by a certain amount. Each set of calculated clusters is "balanced" in that the same buffer type is used for the entire level of leaf nodes so that the timing constraints at each register is similarly impacted. The goal of the ideal clock tree, of course, is for each register to receive the clock signal at exactly the same time so that there is no clock skew between registers. For instance, if the 15-output buffer has a 5 nanosecond propagation delay, then the balanced set of registers all clustered using the 15-output buffer will all experience a 5 nanosecond delay.

Realistically, the total number of nodes will not be evenly divided by the number of nodes that can be driven by a buffer type. Buffers, however, can drive fewer than the maximum number of nodes. In which case, one buffer type can be used for more than one set of clusters. For instance, if there are 145 thousand registers, a cluster set could include 9667 clusters driven by 9667 15-output buffers, all driving 15 registers except one buffer which drives 10 registers. Of course, propagation delay through a buffer may depend on the load, i.e. the number of nodes. In which case, the one 15-output buffer driving only 10 registers may have a significantly shorter propagation delay or transition time, potentially creating clock skew between registers. In which case, in one embodiment, a "balanced" set of clusters is also one that attempts to evenly distribute the number of nodes over the number of buffers. For instance, 145 thousand registers could be driven by 9662 buffers driving 15 registers each and 5 buffers driving 14 registers each. The difference in propagation delay between driving 14 and 15 buffers may be negligible.

In any event, a potentially large number of possible balanced cluster sets are calculated. Any number of techniques can be used to derive the factorization of the number of nodes by the set of available buffers.

In block 440, each calculated cluster set is tested against a design constraint. In the illustrated embodiment, the tested design constraint is the clock transition time at the registers. For instance, the timing constraints may require that the clock signal at each register must transition from high to low, or low to high, in a minimum of 1 nanosecond and a maximum of 2 nanoseconds. Certain buffer types, driving certain numbers of nodes, may not meet the timing constraint.

Timing constraints are often process dependent, meaning that, in order for the type of register being used in a particular IC design to have a known state, the constraints must be met. If the constraints are not met, errors may occur. In which case, in block 445, any cluster set that does not meet the timing constraint is removed from consideration. In the illustrated embodiment, a cluster set is effectively removed from consideration by setting a cost associated with the cluster set to a large value so that it will not be selected in the costing analysis discussed below for block 455.

In block 450, a cost is calculated for cluster sets that met the timing constraint tested in block 440. In one embodiment, cost is equal to the cumulative area necessary to insert the set of buffers plus a cost factor times the propagation delay for the buffer type. That is:

$$COST = AREA + \alpha(DELAY)$$

Different buffer types require different amounts of area. The area for each buffer type may be defined in the input data or retrieved from a default library. In general, buffers which drive larger maximum loads require more area. Also, buffers tend to have longer propagation delays for larger loads. A 15-output buffer used to drive only 10 nodes may actually have shorter delay, but require more area, than a 10-output buffer used to drive the same 10 nodes. That is, depending on which component of the cost equation is emphasized based on the value of $\alpha$, certain cluster sets may have lower associated cost. The cost calculation, and the cost factor $\alpha$ are discussed more fully below. In alternate embodiments, any number of cost equations can be used.

In block 455, a cluster set having the lowest calculated cost is selected for the clock tree solution. That is, for the given cost equation with a given value for $\alpha$, the best cluster set for the leaf node level is selected. Since the cluster sets that did not meet the timing constraint in block 440 were set to large values, such as orders of magnitude greater than any reasonable cost value anticipated using the given cost equation, those cluster sets are effectively removed from consideration.

In alternate embodiments, cost is calculated for all cluster sets, not just those that meet the design constraint. In which case, the design constraint may be tested, and cluster sets that do not meet the design constraint removed from consideration, at any point prior to selecting the lowest cost cluster set.

In block 460, the clock tree synthesizer determines whether or not the root node has been reached. The root node has been reached if all of the nodes in the current level (the leaf node level at this point in the process) are coupled to the root node. Only in very small IC designs will the leaf node level couple directly to the root node. In the example from above, including 150 thousand registers, the leaf node level is many levels removed from the root node.

In block 465, if the root node has not been reached, the nodes for the next level of the clock tree are identified. The buffers forming the clusters for the previous level comprise the set of nodes for the next level of the clock tree. For instance, if the previous level included 150 thousand leaf nodes, and the lowest cost cluster set was 10 thousand 15-output buffers, the nodes for the next level are the 10 thousand buffers. In which case, the process returns to block 430, balanced cluster sets are calculated for 10 thousand nodes, and the best cluster set for the 10 thousand-node level of the clock tree solution is selected based on the cost calculation. Levels of the clock tree are built one on top of the other until the root node is reached in block 460.

The result is a multi-level clock tree solution. Each level is "balanced" in that each level is driven by one type of buffer (or inverter as the case may be). Within each level, in certain embodiments, clusters are also "balanced" in that each cluster includes roughly equally numbers of nodes. The clock signal is propagated to each register through the same number of the same types of buffers.

In block 470, additional design constraints are tested. In one embodiment, only one additional design constraint is tested—the cumulative propagation delay from the root node to the registers. The propagation delay to every leaf node must be between a minimum and maximum value. Alternate embodiments may test the delay and the cumulative area, or any number of other design constraints or combinations of constraints. If any of the constraints are not met, the clock synthesizer proceeds to block 475.

In one embodiment the values for the cost equation are cumulated from one level to the next so that, for instance, cumulative delay and area constraints can be tested in block 470 without recalculating the values.

In block 475, if the additional design constraints are not met, the cost equation is adjusted. In the illustrated embodiment, the cost equation is adjusted by changing the value of the cost factor $\alpha$. Then the process returns to block 420 and begins to build a new clock tree solution starting at the leaf node level. Changing the cost factor changes the emphasis of the cost equation so that different buffer types and cluster structures are likely to be selected.

In one embodiment, the cost factor is adjusted from one iteration of building a clock tree solution to the next using a binary search until the design constraints are met or no acceptable solution can be found. For instance, a range of acceptable cost factor values may go from zero up to some maximum value. For a first iteration through the process, the cost factor can be set to zero. In which case, recalling the cost equation, COST=AREA+$\alpha$(DELAY), if the cost factor $\alpha$ is zero, cost will be equal to area. In other words, the first iteration will select the clock tree solution that has the lowest required area without any consideration whatsoever for delay. In one embodiment, at the end of the first iteration, the area and delay constraints can be tested. If the area constraint is not met, then the clock tree may not be physically possible, and the process may end.

For the delay constraint, the propagation delay must be between the minimum and maximum propagation delay. In general, larger cumulative area often translates into shorter overall propagation delay, and longer propagation delay often translates into smaller area. If the propagation delay is longer than the maximum allowable delay, the cost factor should be increased so delay is more emphasized in the cost equation, likely resulting in a larger cumulative area. In the binary search, starting with a zero cost factor in the first iteration, the cost factor can be set to a value half way between zero and the maximum value for the next iteration.

At the end of the next iteration, if the propagation delay is less than the minimum allowable delay, the cost factor should be decreased from the midpoint in the binary search range in order to place more emphasis on the area element of the cost equation, likely resulting in a longer propagation delay. Conversely, if the propagation delay is still more than the maximum allowable delay, the cost factor should be increased again. In which case, the cost factor should be either be decreased to halfway between the current value and zero, or increased to halfway between the current value and the maximum value. With each subsequent iteration, the binary search range gets smaller and smaller because the cost value is either increased by half from the previous value to reduce delay or decreased by half from the previous value to increase delay until an acceptable clock tree solution is found.

Any number of alternate search techniques can be used in alternate embodiments to adjust the cost equation from one iteration to the next. In one alternate embodiment, the design constraints are tested after each level is added to the clock tree solution rather than waiting until the end of a complete iteration.

In block 470, if the tested design constraints are met, the process proceeds to block 480. In block 480, the clock tree is tested for setup time and/or hold time violations. In block 490, register positions are changed in the clock tree as needed in order to correct any setup time and/or hold time violations. The functions of blocks 480 and 490 are discussed below in more detail with respect FIGS. 5 and 6.

In block 495, the clock tree synthesizer outputs the acceptable clock tree solution.

As discussed above, terminal nodes which are not leaf nodes (nodes at registers) require special consideration. The design constraints associated with terminal nodes are often not the same as design constraints associated with leaf nodes. For instance, a terminal node that is a root node for a partial tree, a gated clock, a divided clock, etc., is likely to have different propagation delay constraints. If the acceptable range of propagation delay for a terminal register is longer the acceptable range for registers, any number of techniques can be used to add delay to the terminal node so that the terminal node can fit into the clock tree at the leaf node level and be included in block 420 for the first iteration of the process illustrated in FIG. 4.

Fitting terminal nodes into the clock tree is more difficult if the range of acceptable delay values is narrower from minimum value to maximum value than for registers, or the maximum allowable delay for a terminal node is shorter than the minimum allowable delay for the register. In one embodiment, both of these cases are addressed by cumulating delay for each level of buffers as they are added to the clock tree. When the cumulative delay of the levels of buffers are approximately equal to the difference in the terminal node delay and the register delay, the terminal node is included in the set of nodes used for the next level of the clock tree solution. That is, in block 465 of FIG. 4, identifying nodes for the next level of the clock tree solution includes comparing cumulative delay of the current level of the clock tree with the difference between terminal node delay constraints and register delay constraints, and adding terminal nodes to the next level if the constraints match, or match to within a particular deviation range.

Figure 5:
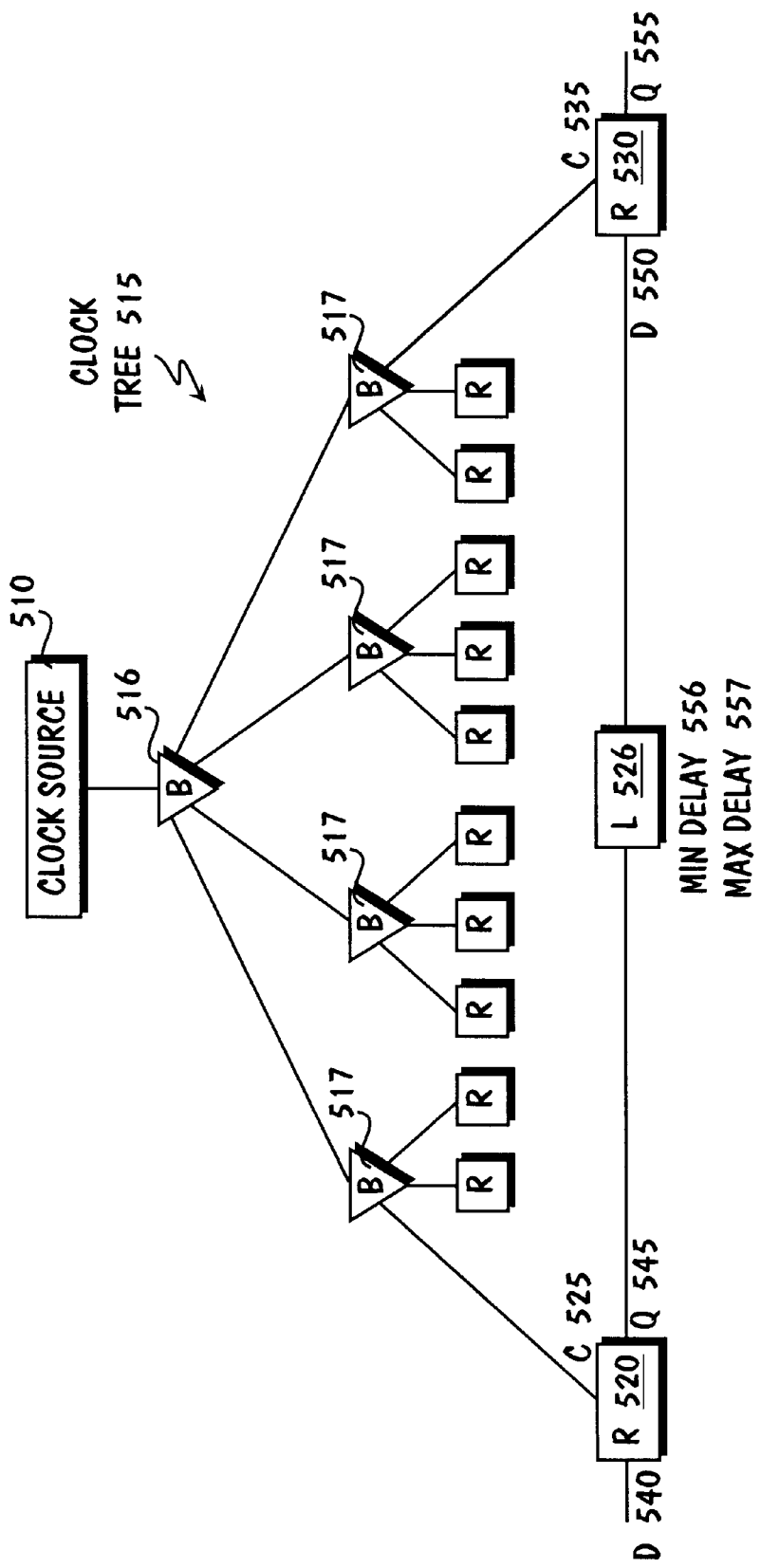
FIG. 5 illustrates a clock tree for which hold time and setup time violations need to be tested.

FIG. 5 illustrates a simple example of a register for which setup time and hold time violations need to be tested as mentioned above in FIG. 4, block 480. Clock source 510 is coupled to clock tree 515. Clock tree 515 is "balanced". Clusters sizes based on buffers 517 are equal. Each cluster within a level is driven by the same kind of buffer, buffers 517. Each register is separated from clock source 510 by the same number and the same kind of buffers, one buffer 516 and one buffer 517. Ideally, each register receives the clock signal at exactly the same time. Realistically, however, slight process variations from buffer to buffer and slightly different path lengths can result in slight variations in cumulative propagation delays experience by two different registers. The difference in delays is called "skew".

When register 520 receives a rising clock edge at clock input 525, a value at data input 540 is latched in and passed to output 545. The value passes through combinational logic 526 and a modified value arrives at the data input 550 of register 530 after a certain amount of delay. The delay from the rising edge at clock input 525 to a value arriving at data input 550 is somewhere between the minimum delay 556 and the maximum delay 557. When the circuit design is operating properly, the value at data input 550 will be clocked into register 530 at the next rising clock edge. The registers are said to be a "dependent" pair of registers, in which register 520 is independent and register 530 is dependent.

Figure 6:
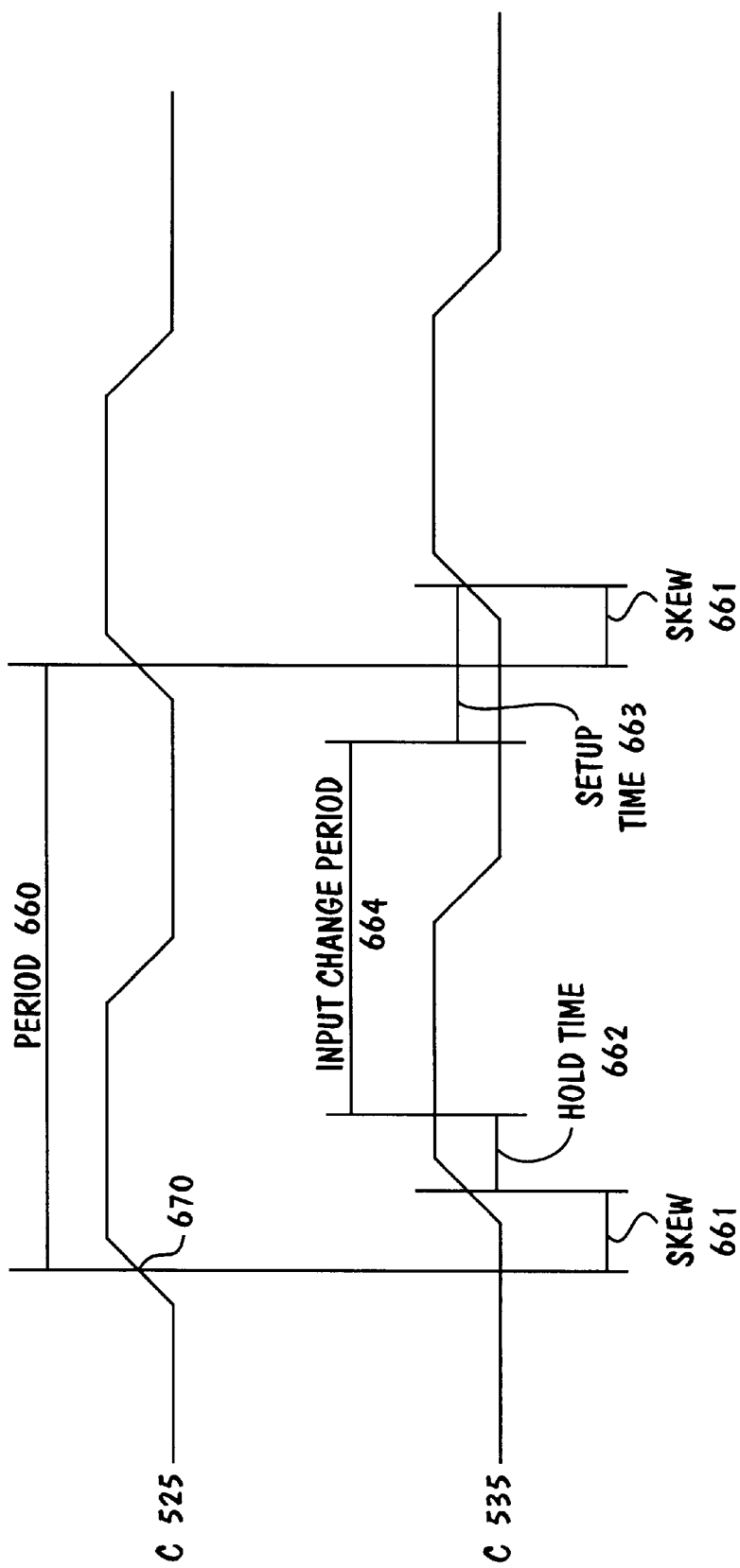
FIG. 6 illustrates a timing diagram with a clock skew between clock signals at two registers.

FIG. 6 illustrates one embodiment of a timing diagram for the clock signal received at clock inputs 525 and 535 from FIG. 5. The difference in the propagation delays from the clock source to the respective registers results in skew 661. That is, the clock signal at register 530 is slightly behind the clock signal at register 520. Design constraints for the registers include hold time 662 and setup time 663. If a value at a data input for a register changes during a setup time before a clock edge or the hold time after a clock edge, the value that appears at the output will be unknown. That is, if the hold time or setup time design constraints are violated, the state of the IC will be unknown. Therefore, the value at data input 550 can only safely change during the period of time labeled 664 in FIG. 6 for a given clock period 660.

In order to prevent hold time or setup time violations, the minimum delay time 556 in FIG. 5, which is measured from the rising clock edge 670 in FIG. 6, must be more than skew 661 plus hold time 662 so that any data change at register 530 happens after hold time 662 and during period 664. Similarly, the maximum delay 557, measured from clock edge 670, must be less than the clock period 660 plus skew 661 minus setup time 663 so that any data change happens before setup time 663 and during period 664. Solving the equations for skew 661:

Max delay 557–Period 660+setup 663<skew 661<min delay 556–hold 662.

Hold time or setup time violations can be detected using this condition. Maximum delay 557 minus period 660 plus setup time 663 is usually negative, and minimum delay 556 minus hold time 662 is usually positive. In which case, setup time and hold time violations are usually eliminated by making the magnitude of the skew as small as possible, zero or nearly zero. Any number of additional methods could also be used to test for violations.

If violations are detected, one embodiment of the present invention attempts to correct the violations by changing positions of registers in the clock tree. The placement of the registers in the IC design is not altered. Instead, the points at which the registers are coupled to the clock tree are changed. For instance, skew is partially a result of process dependent variations between buffers. That is, in the example illustrated in FIG. 5, propagation delay through buffer 517 coupled to register 520 is slightly different from the propagation delay through buffer 517 coupled to register 530. So, to reduce the skew, both registers should be coupled to the same buffer 517 so that they both experience the same delay through the same buffer.

In general terms, in order to reduce skew, registers can be swapped from cluster to cluster in the clock tree so that a dependent pair of registers share as many common buffers as possible. Basically, this means that a dependent pair of registers should be clustered as low as possible in the clock tree, as near to the leaf node level as possible.

Figure 7:
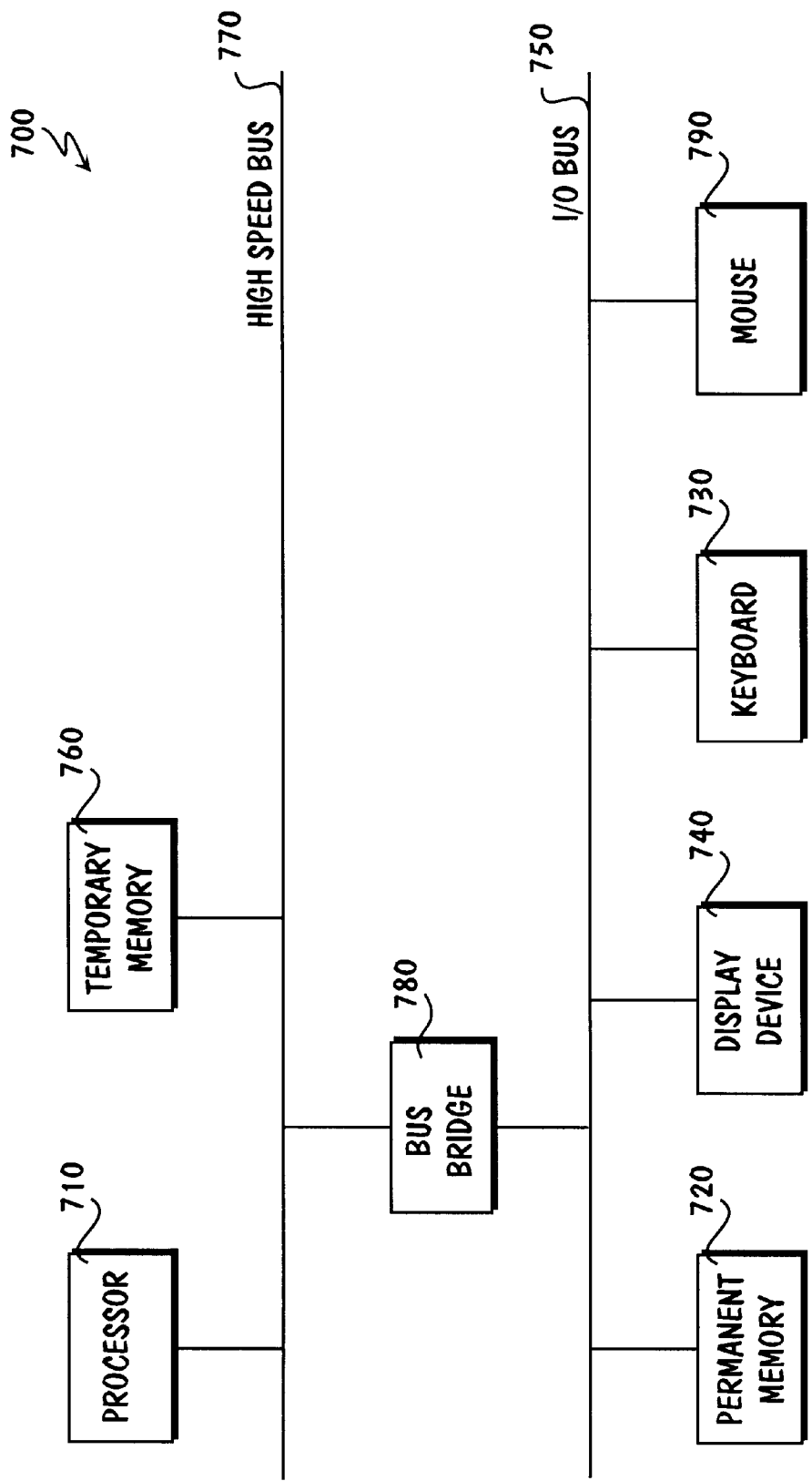
FIG. 7 illustrates one embodiment of a machine used to implement the present invention.

Another approach to reduce hold time and setup time violations within a cluster is to change the order in which a pair of dependent registers are clustered. That is, the independent register should be coupled to the buffer immediately followed by the dependent register. Generally, this will result in a shortest possible variation between transmission paths. FIG. 7 is intended to represent a broad category of computer systems. In FIG. 7, processor 710 includes one or more microprocessors. Processor 710 is coupled to temporary memory 760 by high speed bus 770. High speed bus 770 is coupled to Input/Output bus 750 by bus bridge 780. Permanent memory 720 and Input/Output devices, including display device 740, keyboard 730, and mouse 790, are also coupled to Input/Output bus 750. In certain embodiments, one or more components may be eliminated, combined, and/or rearranged. A number of additional components may also be coupled to either bus 750 and/or 770 including, but not limited to, another bus bridge to another bus, one or more disk drives, a network interface, additional audio/video interfaces, additional memory units, additional processor units, etc.

Figure 8:
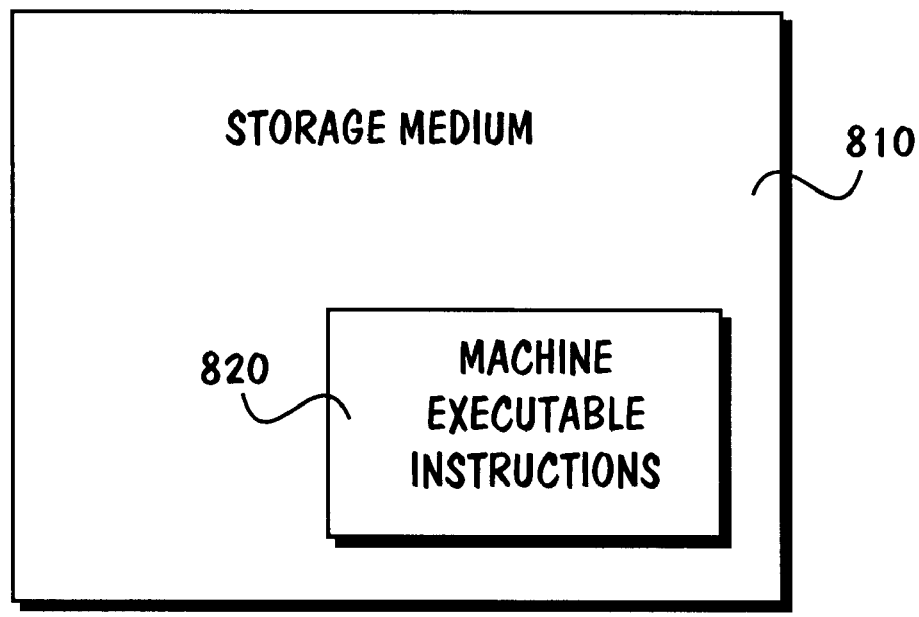
FIG. 8 illustrates one embodiment of a machine readable storage medium to store instructions embodying the present invention.

Clock tree synthesizer 320, as shown in FIG. 3, can be executed by processor 710 as a series or sequence of machine readable instructions or function calls stored, for instance, in permanent memory 720 or temporary memory 760. Alternately, as shown in FIG. 8, machine executable instructions 820, representing the function of clock tree synthesizer 320, could be stored on distribution storage medium 810, such as a CD ROM, a digital video or versatile disk (DVD), or a magnetic storage medium like a floppy disk or tape. The instructions could also be downloaded from a local or remote server.

Alternately, the present invention could be implemented in any number of additional hardware machines. For instance, one or more ASICs (application specific integrated circuits) could be endowed with some or all of the functionality of clock tree synthesizer 320, and inserted into system 700 of FIG. 7 as separate components, or combined with one or more other components.

Thus, an improved method and apparatus for synthesizing clock tree solutions has been described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. A method comprising:
   calculating a plurality of balanced cluster sets for a plurality of nodes comprising a first level of a clock tree in a circuit description for consideration as part of a clock tree solution, each balanced cluster set based on one of a set of available buffer types;

testing each of the balanced cluster sets to determine if a first design constraint is met;

removing each of the balanced cluster sets that do not meet the first design constraint from consideration in the clock tree solution;

calculating a cost associated with each of the balanced cluster sets that do meet the first design constraint using a cost formula; and selecting a lowest cost balanced cluster set for the clock tree solution.

2. The method of claim 1 wherein the lowest cost balanced cluster set comprises a plurality of nodes comprising a next level of the clock tree, the method further comprising:

iteratively repeating the calculating the plurality of balanced cluster sets, testing, removing, calculating the cost, and selecting for each next level of the clock tree up to a root level of the clock tree.

3. The method of claim 1 further comprising:

testing the clock tree to determine if at least one additional design constraint is met;

adjusting a cost factor of the cost formula if the at least one additional design constraint is not met; and repeating the method if the at least one additional design constraint is not met beginning with a leaf node level for the first level.

4. The method of claim 3 wherein the cost formula comprises an area component and a delay component.

5. The method of claim 4 wherein adjusting the cost factor comprises:

selecting a next value in a binary search of a range of cost factor values, the range of cost factor values to define a relative importance of the delay component in the cost formula.

6. The method of claim 4 wherein the binary search begins with a cost factor value that minimizes the relative importance of the delay component in the cost formula.

7. The method of claim 3 wherein the at least one additional design constraint comprises a minimum and maximum clock delay.

8. The method of claim 1 further comprising:

testing a pair of dependent registers at a leaf node level for setup time violations and/or hold time violations, wherein the pair of dependent registers comprises an independent register and a dependent register; and changing positions of the independent register and the dependent register in the clock tree until setup time violations and/or hold time violations are eliminated.

9. The method of claim 8 wherein changing positions of the independent register and the dependent register comprises at least one of:

positioning the independent register and the dependent register at a same low level in the clock tree; and coupling the independent register and the dependent register in a cluster in an order of the independent register followed by the dependent register.

10. The method of claim 1 wherein the first design constraint comprises a minimum and maximum clock transition time.

11. The method of claim 1 wherein removing balanced cluster sets from consideration comprises:

setting a cost associated with each of the balanced cluster sets that do not meet the first design constraint to a large value.

12. The method of claim 1 further comprising:

modifying the clock tree in the circuit description with the lowest cost balanced cluster set selected for the clock tree solution, each cluster including one buffer of the type of buffer on which the calculating was based.

13. The method of claim 1 wherein the set of available buffer types is user defined.

14. The method of claim 2 wherein a number of levels in the clock tree is user defined, and wherein iteratively repeating occurs based on the number of user defined levels.

15. The method of claim 2 further comprising:

comparing a cumulative delay of levels of the clock tree solution with a difference between a delay constraint for a terminal node and a delay constraint for a leaf node; and including the terminal node in the plurality of nodes comprising the next level of the clock tree based on the comparing.

16. The method of claim 1 wherein the plurality of nodes comprising the first level of the clock tree include a terminal node.

17. The method of claim 16 wherein the terminal node includes one of a root of a partial tree, a user defined node, an input to a logic block, an input to a multiplier, and an input to a divider.

18. The method of claim 1 wherein the set of available buffer types includes inverters.

19. An article of manufacture comprising:

a machine readable storage medium;

the machine readable storage medium having stored thereon machine executable instructions, the execution of the machine executable instructions to implement a method comprising:

calculating a plurality of balanced cluster sets for a plurality of nodes comprising a first level of a clock tree in a circuit description for consideration as part of a clock tree solution, each balanced cluster set based on one of a set of available buffer types;

testing each of the balanced cluster sets to determine if a first design constraint is met;

removing each of the balanced cluster sets that do not meet the first design constraint from consideration in the clock tree solution;

calculating a cost associated with each of the balanced cluster sets that do meet the first design constraint using a cost formula; and selecting a lowest cost balanced cluster set for the clock tree solution.

20. An apparatus comprising:

first circuitry to calculate a plurality of balanced cluster sets for a plurality of nodes comprising a first level of a clock tree in a circuit description for consideration as part of a clock tree solution, each balanced cluster set based on one of a set of available buffer types;

second circuitry to test each of the balanced cluster sets to determine if a first design constraint is met;

third circuitry to remove each of the balanced cluster sets that do not meet the first design constraint from consideration in the clock tree solution;

fourth circuitry to calculate a cost associated with each of the balanced cluster sets that do meet the first design constraint using a cost formula; and fifth circuitry to select a lowest cost balanced cluster set for the clock tree solution.

* * * * *